United States Patent [19]

Post et al.

[11] Patent Number: 4,535,290

[45] Date of Patent: Aug. 13, 1985

[54] METHOD FOR MEASURING THE NUCLEAR MAGNETIC RESONANCE FOR NMR TOMOGRAPHY

[75] Inventors: Hans Post, Schriesheim; Dieter Ratzel, Rheinstetten, both of Fed. Rep. of Germany

[73] Assignee: Bruker Medizintechnik GmbH, Fed. Rep. of Germany

[21] Appl. No.: 474,699

[22] Filed: Mar. 11, 1983

[30] Foreign Application Priority Data

Mar. 13, 1982 [DE] Fed. Rep. of Germany ....... 3209264

[51] Int. Cl.$^3$ ............................................. G01R 33/08
[52] U.S. Cl. ..................................... 324/309; 324/307
[58] Field of Search ................ 324/300, 307, 311, 309

[56] References Cited

U.S. PATENT DOCUMENTS 4,015,196  3/1977  Moore ................................. 324/309
4,021,726  5/1977  Garroway ........................... 324/309

Primary Examiner—Michael J. Tokar
Attorney, Agent, or Firm—Fowler, Lambert & Hackler

[57] ABSTRACT

In NMR tomography, the nuclear spins of a selected type present in a selected area of a body are selectively excited by applying first a selection gradient field and exciting thereafter the nuclear spins by a HF signal which initially effects a rotation of the nuclear spins situated in a selected plane by an angle $\alpha$ of less than 90°, then a rotation of all selected nuclear spins by 90° and finally again a rotation of the nuclear spins contained in the selected plane by an angle of $90°-\alpha$. As a result thereof, the nuclear spins contained in the selected area have resumed at the end of this excitation their original orientation determined by a homogeneous magnetic field, while nuclear spins located outside this area lie within a plane extending almost vertically thereto. Thereafter, a measuring gradient field may be switched on without disturbing the orientation of the nuclear spins contained in the selected area. With the measuring gradient field switched on, the nuclear spins are now excited by a 90° pulse or usual pulse sequences to produce an induction signal. The measuring processes are carried out in pairs, with the selection gradient field applied, using different excitation signals so that the nuclear spins contained in the selected area are alternately oppositely directed which means that the induction signals generated by them are phase-shifted by 180°, whereas the nuclear spins situated outside the selected area are shifted in the same sense so that they supply identical signals, if any.

10 Claims, 11 Drawing Figures

METHOD FOR MEASURING THE NUCLEAR MAGNETIC RESONANCE FOR NMR TOMOGRAPHY

The present invention relates to a method for measuring the nuclear magnetic resonance in selected areas of a body for the purpose of representing body cross-sections in the form of images (NMR tomography) comprising the steps of subjecting the body to a homogeneous static magnetic field and superimposing upon the said homogeneous magnetic field a first magnetic field of identical orientation whose strength varies in a first direction (first field gradient), selectively exciting thereafter selected nuclear spins contained in the body in a selected plane extending vertically to the direction of the first space coordinate and defined by the Larmor frequency of the selected nuclear spins in the magnetic field resulting from the superimposition of the said homogeneous magnetic field and the said first gradient field, applying thereafter another gradient field exhibiting in turn an orientation identical to that of the homogeneous magnetic field and varying in a direction vertical to the direction of the said first space coordinate, and processing finally the induction signals supplied by the nuclear spins excited by the said homogeneous magnetic field and the said other gradient field, to form image signals.

NMR tomography, also known as NMR zeugmatography or NMR imaging, is a method which has been developed only quite recently for producing cross-sectional images of organic bodies on the basis of the density distribution of certain nuclear species, in particular the protons of water but also, for instance, of carbon or phosphorus. It is to be expected that NMR tomography will play an important role in the future as diagnostic method in human medicine. The methods of NMR tomography known heretofore have been described in summary form in a paper by Hesse entitled "Kernresonanzbilder" (nuclear resonance images) published in "Mitteilungen der Technischen Universität Carolo-Wilhelmina zu Braunschweig", Vol. XVI, number 1, 1981. The practical importance which the methods described therein will gain in the future depends largely on the degree of accuracy offered by the individual methods in selectively exciting the nuclear spins selected for imaging and situated in a volume element corresponding to an image point. If one considers that depending on the desired resolution of the image such a volume element is smaller by 3, 4 and more orders of magnitude than the total volume of the body to be examined, it will be easily realized that with an excitation selectivity in the percentage area a noise signal of a magnitude many times greater than that of the desired signal may be obtained.

Further, the complexity and cost of the apparatus required for recording a picture and the data-processing connected therewith, and the necessary measuring time play of course an important role, too. In this respect, the method mentioned before seems to be suited for practical use. It consists of a combination of the application of switchable gradients, accompanied by selective excitation, described in the above paper, and the projection method and comprises the steps of selecting a body plane by selective excitation while a selection gradient is applied, switching off the selecting gradient and applying a measuring gradient for determining the density distribution of the nuclear spins in the selected plane along the measuring gradient. If the direction of the measuring gradient is varied in small steps in the selected plane, by rotation about the sense of the selection gradient, a plurality of density distributions in the selected plane is obtained which can be combined by calculation using the projection method to obtain an image.

In practice, however, the application of this method is still connected with considerable problems because the selectively excited spins are gravely disturbed when the selection gradient is switched off and the measuring gradient is switched on. This disturbance is due to the fact that switching of the gradients cannot be carried out with infinite rapidity but requires a finite period of time during which the excited spins are differently influenced by the changing magnetic field, depending on their respective phase positions relative to the said magnetic field. This disturbance leads on the one hand to an attenuation of the induction signal when the measuring gradient is applied and renders it impossible on the other hand, due to the uncontrolled distribution of the excited spins in the plane extending vertically to the direction of the magnetic field, to apply pulse sequences of the type normally used for improving the signal-to-noise ratio, such as, for instance, the Carr-Purcell sequence.

Now, it is the object of the present invention to improve the method described above so that the excited spins will no longer be disturbed by the switching of the gradient fields and that, accordingly, the selected spins can be excited not only by 90° pulses, but also by special pulse sequences.

According to the present invention, this object is achieved by the steps of exciting in addition, when the first gradient field is applied, the entirety of the selected nuclear spins present within the homogeneous magnetic field, and effecting the selective excitation of the nuclear spins located in the selected body plane in such a manner that the selected nuclear planes located in the said plane are shifted back into the direction of the homogeneous magnetic field so that their orientation is identical with or, alternatively, opposite to that of the magnetic field, effecting after application of the gradient field a repeated excitation of the selected nuclear spins contained in the selected plane so that these nuclear spins supply the desired induction signal, and carrying out the measurements in pairs with nuclear spins oriented alternately in the same and in opposite direction to the homogeneous magnetic field and subtracting the obtained induction signals from each other.

Preferably, the entirety of the nuclear spins is excited by a 90° pulse, when the first gradient field is applied.

So, it is a special feature of the method of the invention that during application of the first gradient field which supplies the before-mentioned selection gradient for selecting a body plane, one effects on the one hand a selective excitation of the nuclear spins present in the selected plane and on the other hand, by means of a suitable broadband signal, an additional excitation of the entirety of the spins contained in the whole body volume so that upon completion of the excitation process the nuclear spins contained in the selected plane have been excited twice, once selectively and once together with all the rest of the nuclear spins of the whole body. As a result of the second excitation, the nuclear spins contained in the selected plane have been shifted back into the direction of the homogeneous magnetic field, which is usually designated as Z direction, while the spins in the rest of the volume of the body have been displaced from the Z direction. When a 90° pulse has been applied, the spins are now in a plane extending vertically to the direction of the homogeneous magnetic field, which is usually designated as X,Y plane. The spins shifted in the X,Y plane suffer a dispersion in this plane which becomes very important when the duration of the excitation signal exceeds the duration of the spin-spin relaxation time $T_2$. This dispersion is further considerably aggravated by the switching of the gradient fields, an effect which, contrary to the known methods, is absolutely desired in the method of the invention. Accordingly, switching of the gradient fields may be carried out slowly, which offers the particular advantage that no rapid current changes need be enforced so that the design input required for switching the gradients can be kept small. The nuclear spins contained in the selected plane have resumed the Z direction so that they remain absolutely unaffected by the switching of the gradient fields. When after application of the second gradient field, i.e. the measuring gradient, a repeated excitation of the selected nuclear spins is effected, for instance by means of a 90° pulse, the nuclear spins contained in the selected plane are shifted into the X,Y plane and supply the induction signal in the conventional manner, whereas no signal is received from the rest of the nuclear spins of the body, regardless of whether or not they were influenced by the 90° pulse, because the signal portion supplied by them is largely canceled because of the above-described dispersion. If a residual signal should still be present, it is eliminated by the two-fold measurement with subtraction of the induction signal provided by the invention. In fact the selected type of excitation ensures that the undesirable signals supplied by the non-selected nuclear spins are identical in each measurement, while the nuclear spins selectively excited in the selected plane supply signals alternately shifted in phase by 180°, i.e. alternate positive and negative signals. So, the identically oriented signals obtained from the undesired nuclear spins are eliminated during the subtraction process, while the desired signals supplied by the selected nuclear spins are added due to their phase shift, which ensures that the induction signals resulting from the subtraction have been supplied exclusively by the nuclear spins in the selected plane.

But the particular advantage of the method of the invention is not only to be seen in the fact that it achieves perfect elimination of signals derived from nuclear spins outside the selected area of the body to be examined. Rather, it is also of great importance that the nuclear spins contained in the selected area remain unaffected by the switching of the gradients and that their excitation for the purpose of producing the induction signal is effected only after the measuring gradient has been switched on so that not only 90° pulses can be used for exciting the nuclear spins contained in the selected plane, but also pulse sequences permitting long observation periods and, thus, an improvement of the signal-to-noise ratio. A pulse sequence frequently used is the Carr-Purcell sequence wherein a 90° pulse is followed in selected time intervals by 180° pulses.

It has been known already from U.S. Pat. No. 4,021,726 to ensure that the nuclear spins contained in the selected plane are oriented during switching of the gradient fields in the direction of the homogeneous magnetic field, and excited for supplying an induction signal only after the measuring gradient has been switched on. But in this known method the selection of a body plane is effected by saturating all spins located outside the plane by application of a HF signal. In practice it is, however, very difficult to generate a HF signal which while ensuring complete saturation of all spins located outside the selected plane does not, on the other hand, detrimentally affect the spins to be found within the selected plane. In practice it seems impossible to generate such a signal so that no device has become known to this date which uses this method.

If, on the one hand, the spins located outside the selected plane are incompletely saturated, the very important noise signal mentioned before is obtained, while an undesirable saturation of the spins contained in the selected plane leads to a loss of desired signal. The compensation measures provided by the invention cannot be applied without difficulty in the known methods. It may, however, be convenient also in the method of the invention to subject the body after application of the first gradient field to a HF signal effecting a substantially complete saturation of the selected nuclear spins located outside the selected plane, prior to exposing the nuclear spins to the excitation fields. In this manner, the proportion of disturbing nuclear spins to be eliminated later by the method of the invention can be reduced from the very beginning. So, the extremely effective selection guaranteed by the method of the invention may even be further improved under certain circumstances.

In a further improvement of the method of the invention, the excitation of the nuclear spins during application of the first gradient field can be effected by a HF signal which effects initially a rotation of the nuclear spins arranged in the selected plane by an angle $\alpha$ of less than 90°, then a rotation of all selected nuclear spins by 90°, and finally once more a rotation of the nuclear spins found in the selected plane by an angle of $90° - \alpha$, so that the rotations by the angles $\alpha$ and $(90° - \alpha)$ are effected alternately in the same and in opposite direction, relative to the 90° rotation. In a preferred embodiment of the method of the invention, the angles $\alpha$ and $(90° - \alpha)$ are equal to 45° each. The HF signal used for exciting the nuclear spins may consist either of a sequence of separate pulses with different carrier frequencies, amplitudes and/or phases or else of a uniform pulse with varying carrier frequency, amplitude and/or phase.

The application of a symmetrical pulse or a symmetrical pulse sequence, i.e. a pulse sequence wherein the angles and $(90° - \alpha)$ amount to 45° each, is particularly advantageous as regards the self-compensation of errors.

The method of the invention is not only suited for selecting, by application of a selection field, a plane in a body for which the induction signals can then be produced in selected directions. Rather, before applying the other gradient field, i.e. the measuring field, it is also possible to apply a second gradient field, i.e. a second selection field, which is likewise oriented in the same sense as the homogeneous magnetic field and whose strength varies in a second direction vertical to the directions of variation of the first and the other gradient fields, in order to thereby define in the plane selected during application of the first gradient field, after application of the second gradient field, by repeated excitation of the spins present in the previously selected plane, a strip extending in parallel to one diameter in which due to the two-fold excitation the spins are again oriented in parallel to the Z direction, before switching off the second gradient field and applying the other gradient or measuring field for exciting the selected nuclear spins. In this case, the induction signal represents the density distribution along the selected strip and can be easily translated into a video signal characteristic of the image points along an image line which corresponds to the selected strip in the selected plane.

It goes without saying that the method of the invention provides also the possibility to effect a third excitation using a third gradient field to select a defined volume element which is the only one to contain nuclear spins which after such excitation are still oriented in Z direction, and to excite the nuclear spins in the said isolated volume element after all gradient fields have been switched off. In this case, all gradient fields would be eliminated so that a homogeneous magnetic field would be encountered in the selected volume element which would principally permit high-resolution NMR spectroscopy to be carried out in respect of this volume element. As regards the representation in the form of images, the design input and cost required for such a selection of the volume elements seem to be unreasonable as signals characteristic of individual volume elements which permit a representation of a body cross-section in the form of an image, without additional calculations, are obtained already after two-fold selection and application of a measuring field.

The invention will be described and explained hereafter with reference to the diagrams shown in the drawings in which FIG. 1 is a diagrammatic representation of a body to be examined, shown in a coordinate system related to the said body;

Figure 1:
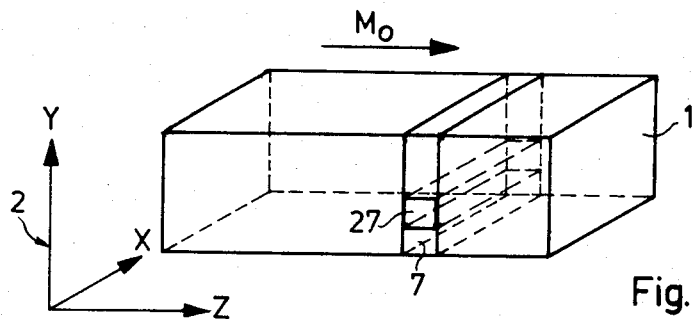

FIG. 1 shows a rectangular sample body 1 and a related coordinate system 2 whose Z axis coincides with the longitudinal extension of the body 1, while the X and Y axes extend perpendicularly to the Z axis and to each other and in the same direction as the two other edges of the body 1. Accordingly, the X,Y plane defined by the X and Y axes is parallel to a cross-sectional plane of the body 1. The body 1 is continuously subjected to a strong homogeneous magnetic field $M_O$ extending in the direction of the Z axis. The static homogeneous magnetic field $M_O$ causes the nuclear spins contained in the body 1 to orient themselves in parallel to the Z axis and to retain this orientation unless they are excited to effect precessional oscillations around the said axis. As regards the orientation and excitation of the nuclear spins and the observation and evaluation of the induction signals supplied by the excited nuclear spins, these are well known from NMR Fourier spectroscopy and need not be explained here in detail.

To carry out the method of the invention, one superimposes upon the homogeneous magnetic field $M_O$ a first gradient field $G_Z$ wich extends in parallel to the homogeneous magnetic field $M_O$ and whose strength varies in the example shown in the direction of the Z axis so that the Larmor frequency of the nuclear spins varies in the direction of the Z axis, in response to the field gradient. Accordingly, the Larmor frequency of a selected nuclear spin is different for each cross-sectional plane of the body 1.

During application of the first gradient field $G_Z$ (see FIG. 2a) the HF pulse 3 is applied to the body 1. The HF pulse consists of a chronological sequence of sections 4, 5 and 6 of equal carrier frequency, but different amplitude and phase. The amplitude curve of the section 4 of the HF pulse 3 is such that nuclear spins selected due to its spectral frequency distribution, for instance protons, and situated during the application of the gradient field $G_Z$ in a selected cross-sectional plane 7 of the body 1 are selectively excited with a specific Larmor frequency so that they are shifted by −45° in the Z, X plane, whereafter these spins occupy the position indicated by pointer 8 in FIG. 3. The following signal portion 5 has a band width and energy sufficient to impose upon all selected nuclear spins present in the body 1, i.e. in the present example all proton spins, a shift by +90° about the Z, X axis, so that all protons outside the selected plane 7 are rotated in X direction, as indicated by pointer 9 in FIG. 3, while the spins contained in the plane 7 are shifted from the −45° position into the +45° position indicated by pointer 10 in FIG. 3. The last signal portion 6 which is equal in phase to the signal portion 4 effects, just as the latter, a selective rotation of the selected spins present in the plane 7 by −45° so that these spins resume again the Z direction, while the spins 7 located outside this plane retain their position in the X, Y plane.

Figure 2A:
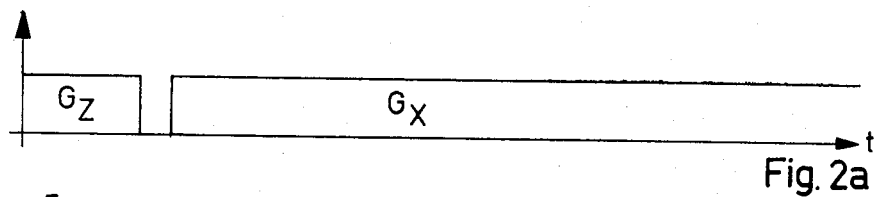
FIGS. 2a–2e shows time diagrams illustrating the application of different gradient fields and the coordination of different signals.
Figure 3:
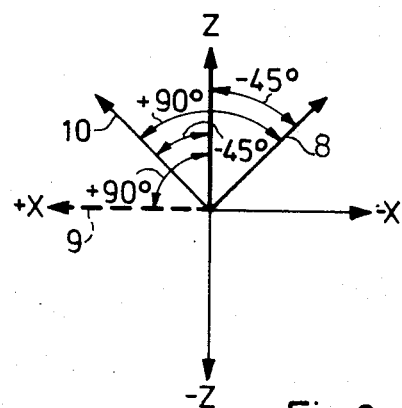
FIGS. 3 and 4 show vector diagrams of the shifts of nuclear spins effected by application of the signals shown in FIG. 2.

Thereafter, the gradient field $G_Z$ is switched off and a gradient field $G_X$ is switched on instead (FIG. 2a). The latter has likewise an orientation parallel to the homogeneous magnetic field $M_O$, but a strength varying in X direction. Considering that the gradient fields $G_Z$ and $G_X$ extend in parallel to the homogeneous magnetic field $M_O$, the nuclear spins in the selected plane 7 oriented in parallel to the homogeneous magnetic field $M_O$ are not affected by the switching of the gradient fields, whereas the position of the excited nuclear spins present outside the plane 7 is changed in the X, Y plane due to the variation in time of the magnetic field encountered when switching the gradient fields on and off. Thus, the distribution of these nuclear spins in the plane X, Y caused already by the normal spin-spin relaxation is aggravated in an absolutely desirable manner.

Figure 2B:
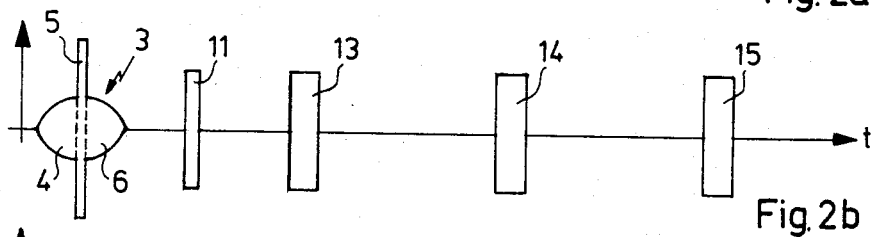
Figure 2C:
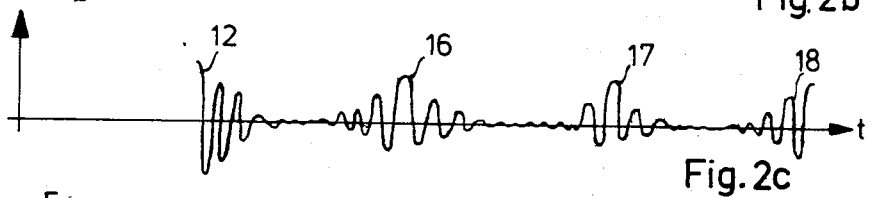

After application of the $G_X$ gradient field, the selected spins of the body 1 are excited by means of a 90° pulse 11 (see FIG. 2b), whereby the selected nuclear spins in the plane 7 are shifted into the X, Y plane where they perform a precessional movement which generates the induction signals 12 received and evaluated in NMR Fourier spectroscopy (FIG. 2c). The 90° pulse may be followed in conventional manner by other pulses 13, 14, 15 of a usual pulse sequence, as used in NMR spectroscopy for improving the signal-to-noise ratio. FIG. 2b illustrates a Carr-Purcell sequence in which the first 90° pulse 11 is followed by a number of 180° pulses 13, 14, 15 . . . . Accordingly, the first induction signal 12 is followed by further induction signals 16, 17, 18 . . . which are added up in the known manner for improving the signal-to-noise ratio.

Figure 2D:
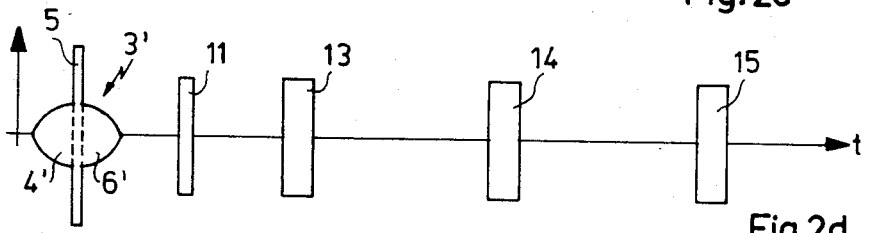
Figure 2E:
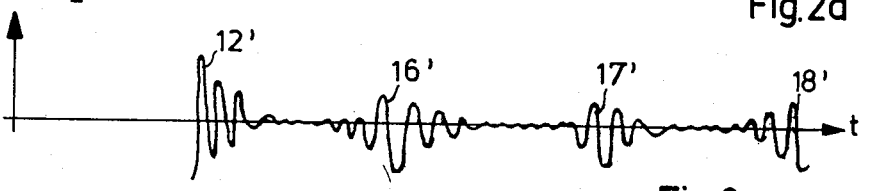
Figure 4:
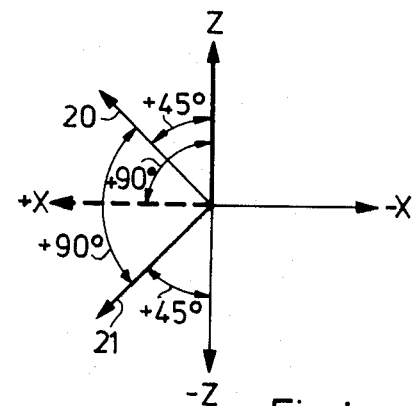

The selected nuclear spins located outside the plane 7 in the body 1 are also affected by the 90° pulse 11, but this differently, depending on their phase position within the X, Y plane, so that a certain portion is shifted in the Z direction, another portion in the −Z direction. As far as these nuclear spins are orientated in the Z direction, they do not supply any contribution to the induction signal. To the extent they are not shifted back to this direction, it may be assumed due to the spin-spin relaxation and the disturbance provoked by the switching of the gradients that these nuclear spins were uniformely distributed over the X, Y plane so that their signal components cancel each other. Thus, an effective selection is achieved already in this manner. Still it cannot be excluded that the nuclear spins located outside the selected plane 7 contribute a considerable signal portion, the volume of the body 1 being much greater than the volume of the selected plane 7. In order to avoid such disturbing signal portions, the method of the invention provides for a repetition of the measurement just described, but this time with an excitation signal 3' whose signal portions 4' and 6' differ from the signal portions 4 and 6 of the excitation signal 3 shown in FIG. 2b in that they effect a rotation by 45° in a direction identical to that of the 90° rotation of the signal portion 5 (FIGS. 2d and 4). The first signal portion 4' thus rotates the spins from the Z direction in the Z, X plane by +45° into the position illustrated by pointer 20 in FIG. 4. During application of the final 90° pulse 5, the nuclear spins located outside the selected plane 7 are, just as in the preceding experiment, shifted from the Z direction into the +X direction, while the selected nuclear spins in the plane 7 are shifted from the 45° position by 90° into the 135° position indicated by pointer 21 in FIG. 4. The signal portion 6' then effects another rotation of the selected nuclear spins in the plane 7 by +45° so that these spins are shifted into a −Z direction. Accordingly, the induction signals 12', 16', 17', 18' (FIG. 2e) obtained during the subsequent excitation by the pulse sequence 11, 13, 14, 15 are opposite in phase to the induction signals 12, 16, 17, 18 previously obtained, as regards the signal portion supplied by the nuclear spins in plane 7. In contrast, the signal portion supplied by the nuclear spins located outside the plane 7 has not been changed in any manner by the signal 3' so that when a subtraction of the signals received during the successive measurements is carried out, the disturbing portion of the induction signals supplied by the nuclear spins located outside the plane 7 is eliminated, while the portion of the induction signal supplied by the nuclear spins in the plane 7 adds up. It goes without saying that the output signals 3 and 3' could also be selected in a manner such that the desired induction signals received are equal in phase and the disturbing signals are opposite in phase so that the latter are eliminated when adding up the signals.

Thus, the particular type of excitation used in the method of the invention permits, on the one hand, to minimize the level of the disturbing signals from the very beginning and, on the other hand, to eliminate any residual disturbing signals by the subtraction step. The signals received after subtraction are, therefore, substantially free from disturbing signals, and the frequency spectrum of the induction signal gained represents substantially the density distribution of the selected nuclear spins in strips extending in parallel to the Y direction and following each other in the plane 7 in X direction. If these measurements are repeated with the coordinate system in different rotary positions about the Z axis, it is possible with the aid of the before-mentioned projection method to calculate from these density distributions the density of the nuclear spins in individual elements of the plane 7 which permits again a representation in the form of images.

Figure 5A:
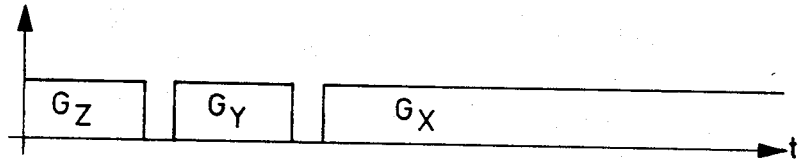
FIGS. 5a–5c is another time diagram similar to that shown in FIG. 2.

By selectively exciting nuclear spins in two different gradient fields it is possible to restrict the selective excitation of the selected nuclear spins to a selected strip 27 extending in the selected plane 7. As can be seen in FIG. 5, one ensures for this purpose initially by applying a gradient field $G_Z$ and an excitation signal 3 that the selected nuclear spins located in the plane 7 of the body 1 selected along the Z direction have resumed an orientation in the Z direction, while the nuclear spins outside this plane are distributed over the X, Y plane. Thereafter, the gradient field $G_Z$ is switched off and replaced by a gradient field $G_Y$ which is again parallel to the Z axis, but whose field strength varies in Y direction. Now, it is ensured by another excitation signal 3 that only the selected nuclear spins contained in a strip 27 along the Y direction are shifted back into the Z direction while the nuclear spins outside the strip 27 in the plane 7 have been rotated into the X, Y plane. During this process, the nuclear spins outside the plane 7 are likewise subjected to additional rotations, but this is without major importance considering that—as mentioned before—these nuclear spins have been substantially uniformly distributed over the X, Y plane so that their induction signals will largely compensate each other. If no such compensation is obtained, they are eliminated by the before-described subtraction.

After excitation of the selected nuclear spins, with the gradient field $G_Y$ applied, this gradient field is also switched off and replaced by the gradient field $G_X$. Now, a pulse sequence 11, 13, 14 ... is applied to obtain the described induction signal which is characteristic of the density distribution of the selected nuclear spins in the strip 17 in X direction. The frequency spectrum resulting from the induction signals can be translated directly into the intensity of image points of an image line conforming to the selected strip 27 of the body 1.

Figure 5B:
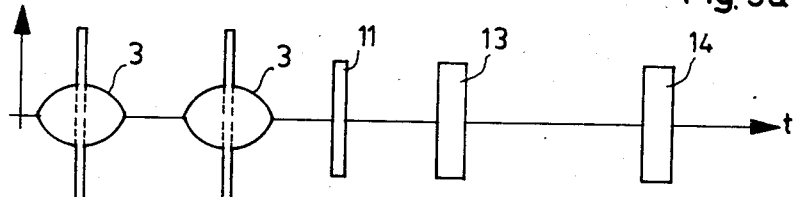
Figure 5C:
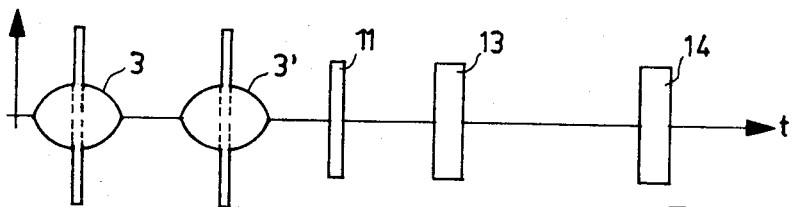

For the measurement required for effecting the signal subtraction, only one of the two excitation signals, namely the one shown in FIG. 5c, has to be varied relative to the first corresponding excitation signal shown in FIG. 5b in order to achieve a reversal in orientation of the selected nuclear spins in the selected area and, thus, to achieve the desired result when subtracting the signals. According to FIG. 5c, the excitation for both successive measurements is effected, when the gradient field $G_Z$ prevails (FIG. 5a), using an excitation signal 3 which causes the selected spins present in the selected plane 7 to be returned in the same manner to the +Z direction, while when the gradient field $G_Y$ prevails different excitation signals 3 and 3' are used which provoke a shift in the +Z and −Z direction, respectively. This, namely that it must be ensured for the second measurement that only one of the excitation signals effects a rotation in the −Z direction, explains itself by the fact that only the position of the selected nuclear spins in the selected area counts when the measuring pulse and/or a measuring pulse sequence is applied.

As mentioned before, it is in principle possible to apply to the test body, while the selection gradient fields are applied, but prior to applying the excitation signal proper, a saturation signal by which all nuclear spins situated outside the desired area are saturated. Considering that for the reasons outlined before it is of crucial importance to suppress all interfering signals as fully as possible, and considering further that there is no method that could fully eliminate all undesirable signals, it may be convenient also, with a view to improving the results obtainable by the method of the invention to use other methods, to minimize the interference level from the very beginning.

As has also been mentioned before, the method of the invention can be further extended in that when the third gradient field is applied, one does not apply a measuring pulse or a measuring pulse sequence, but rather another excitation signal which results in a situation in which the selected nuclear spins present in a selected volume element are the only ones that are still oriented in Z direction. Then, when this third gradient field has also been switched off, these nuclear spins can be excited to obtain oscillations supplying an induction signal. Although this additional measure is of no importance for the imaging process as such, it offers the possibility to subject individual volume elements to a more thorough examination and to effect high-resolution NMR spectroscopy in respect of these volume elements. In this manner, one can observe for instance metabolic processes in living organisms, without the necessity to subject the organism to a mechanical operation.

The method of the invention can be carried out with the devices heretofore known for performing NMR tomography, which comprise the synthezisers and pulse generators for generating the required HF signals, and the known devices for generating the homogeneous magnetic field and the switchable gradient fields.

We claim:

1. A method useful in NMR tomography for measuring the nuclear magnetic resonance in selected areas of a body for the purpose of representing body cross-sections in the form of images comprising the steps of subjecting the body to a homogeneous static magnetic field $M_O$ and superimposing upon the said homogeneous magnetic field a first magnetic field gradient $G_Z$ of identical orientation whose strength varies in the direction of a first space coordinate Z of the body, selectively exciting thereafter selected nuclear spins contained in the body in a selected X-Y plane extending perpendicular to the direction of the first space coordinate Z and defined by the Larmor frequency of the selected nuclear spins in the magnetic field resulting from the superimposition of the said homogeneous magnetic field and the said first gradient field $G_Z$, applying thereafter another gradient field exhibiting in turn an orientation identical to that of the homogeneous magnetic field and varying in a direction perpendicular to the direction of the said first space coordinate Z and processing finally the induction signals supplied by the nuclear spins excited by the said homogeneous magnetic field and the said other gradient field to form image signals, characterized by the steps of exciting, when the first gradient field $G_Z$ is applied, the entirety of the selected nuclear spins present within the homogeneous magnetic field $M_O$, and effecting the selective excitation of the nuclear spins located in the selected X-Y body plane a manner causing the selected nuclear spins located in the said X-Y plane to be shifted back into the direction of the homogeneous magnetic field $M_O$ so that their orientation is identical with or, alternatively, opposite to that of the homogeneous magnetic field, effecting after application of the gradient field $G_X$ a repeated excitation of the selected nuclear spins contained in the selected X-Y plane so that these nuclear spins supply a desired induction signal, and carrying out the measurements in pairs with nuclear spins oriented alternately in the same and in opposite direction to the homogeneous magnetic field $M_O$ and subtracting the obtained induction signals from each other.

2. A method in accordance with claim 1, characterized in that when the first gradient field $G_Z$ is applied the entirety of the nuclear spins is excited by a 90° pulse.

3. A method in accordance with claim 1 or 2, characterized in that when a further gradient field $G_X$ is applied, an excitation of the selected nuclear spins is effected using a pulse sequence which provides an improvement of the signal-to-noise ratio for the induction signal.

4. A method in accordance with claim 1, characterized in that after application of the first gradient field the body is subjected to a HF signal which effects a substantially complete saturation of the selected nuclear spins situated outside the selected X-Y plane, before the nuclear spins are subjected to the excitation fields.

5. A method in accordance with claim 1, characterized in that the excitation of the nuclear spins during application of the first gradient field can be effected by a HF signal which effects initially a rotation of the nuclear spins arranged in the selected X-Y plane by an angle $\alpha$ of less than 90°, then a rotation of all selected nuclear spins by 90°, and finally once more a rotation of the nuclear spins found in the selected X-Y plane by an angle of $90° - \alpha$, so that the rotations by the angles $\alpha$ and $(90° - \alpha)$ are effected alternately in the same and in opposite direction, relative to the 90° rotation.

6. A method in accordance with claim 5, characterized in that the angles $\alpha$ and $(90° - \alpha)$ amount to 45° each.

7. A method in accordance with claim 1, characterized in that the HF signal used for exciting the nuclear spins when the first gradient field is applied consists of a sequence of separate pulses having different carrier frequencies, amplitudes and/or phases.

8. A method in accordance with claim 1, characterized in that the HF signal used for exciting the nuclear spins when the first gradient field $G_Z$ is applied is formed by a symmetrical pulse with alternating carrier frequency, amplitude and/or phase.

9. A method in accordance with claim 1, characterized in that prior to applying the other gradient field $G_X$ a second gradient field $G_Y$ is applied which has the same orientation as the homogeneous magnetic field $M_O$ but whose strength varies in a second direction Y perpendicular to the directions of variation, Z or X of the first and the other gradient fields and that the excitation of the selected nuclear spins when the second gradient field $G_Y$ is applied is effected in the same manner as when the first gradient field $G_Z$ is applied.

10. A method in accordance with claim 1, characterized in that after application of the other gradient field $G_X$ the selected nuclear spins are excited in the same manner as when the first gradient field $G_Z$ is applied and that the excitation of the selected nuclear spins is effected after all gradient fields have been switched off.

* * * * *